United States Patent [19]

Kurosawa et al.

[11] Patent Number: 4,472,874

[45] Date of Patent: Sep. 25, 1984

[54] METHOD OF FORMING PLANAR ISOLATION REGIONS HAVING FIELD INVERSION REGIONS

[75] Inventors: Kei Kurosawa, Tokyo; Tadashi Shibata, Kanagawa, both of Japan

[73] Assignee: Tokyo Shibaura Denki Kabushiki Kaisha, Japan

[21] Appl. No.: 384,648

[22] Filed: Jun. 3, 1982

[30] Foreign Application Priority Data

Jun. 10, 1981 [JP] Japan .................................. 56-88257
Sep. 14, 1981 [JP] Japan ................................. 56-143798
Sep. 14, 1981 [JP] Japan ................................. 56-143799
Sep. 30, 1981 [JP] Japan ................................. 56-155170

[51] Int. Cl.³ ................. H01L 21/263; H01L 21/225; H01L 7/54
[52] U.S. Cl. .................... 29/576 B; 29/571; 148/1.5; 148/187; 357/91
[58] Field of Search ............... 148/1.5, 187; 29/576 B, 29/571; 357/91

[56] References Cited

U.S. PATENT DOCUMENTS

| | | | |
|---|---|---|---|
| 3,997,367 | 12/1976 | Yau | 148/1.5 |
| 4,149,904 | 4/1979 | Jones | 148/1.5 |
| 4,182,023 | 1/1980 | Cohen et al. | 29/571 |
| 4,198,250 | 4/1980 | Jecmen | 148/1.5 |
| 4,218,267 | 8/1980 | Maddox, Jr. | 148/1.5 |
| 4,354,307 | 10/1982 | Vinson et al. | 29/571 |
| 4,356,042 | 10/1982 | Gedaly et al. | 148/1.5 |
| 4,373,965 | 2/1983 | Smigelski | 148/1.5 |
| 4,385,947 | 5/1983 | Halfacre et al. | 148/187 |

*Primary Examiner*—Upendra Roy
*Attorney, Agent, or Firm*—Finnegan, Henderson, Farabow, Garrett & Dunner

[57] ABSTRACT

A method for manufacturing integrated circuit devices wherein semiconductor elements are isolated by insulation material comprising the following steps of: (a) providing a mask pattern on a predetermined semiconductor element region of a semiconductor substrate; (b) introducing by first ion-implantation impurities of the same conductivity type as that of the substrate into the substrate using the mask pattern as an ion-implantation mask; (c) etching the substrate and forming a groove using the mask pattern as an etching mask in a manner that part of the impurities remain at least under the mask pattern in the side walls of the groove; (d) introducing by second ion-implantation impurities of the same conductivity type as that of the substrate through the groove into the substrate; (e) burying insulation material in the groove; and (f) forming a semiconductor element on the predetermined semiconductor element region.

9 Claims, 13 Drawing Figures

METHOD OF FORMING PLANAR ISOLATION REGIONS HAVING FIELD INVERSION REGIONS

FIELD OF THE INVENTION

This invention relates to an improved method for manufacturing integrated circuit devices wherein semiconductor elements are isolated from each other by insulation material buried in one or more grooves of a semiconductor substrate.

BACKGROUND OF THE INVENTION

There is usually provided a thick oxide layer on the field area between semiconductor element regions on a semiconductor integrated circuit device to prevent lack of isolation caused by parasitic effects.

The method of isolating elements using such an oxidation layer is the BOX (Burying Oxide into Silicon Groove) method which is well-known. The BOX Method includes the following steps.

First a resist mask for etching and ion-implantation is provided on a predetermined element region of a semiconductor substrate.

Next, a field area of the substrate is etched to a certain depth and a groove surrounding the predetermined element region is formed. Impurities of the same conductivity type as that of the substrate are introduced into the groove by ion-implantation technique for preventing conductivity type inversion.

After this, an oxidation layer is buried in the groove through a conventional lift-off method. Furthermore, semiconductor elements, for example insulated gate type field effect transistors, are formed on the predetermined element region of the semiconductor substrate. Then metal interconnections are provided between the semiconductor elements.

According to the BOX Method, the size of the element region is defined by the resist mask for etching and ion-implantation which is provided in advance on the semiconductor substrate. Therefore integrated circuit devices made through the BOX Method have less dimension error and meet high integration density. Furthermore, the BOX Method contributes to high lithography accuracy for the wiring process and higher reliability, because the surface of the substrate remains flat.

According to the above BOX Method, the impurities for preventing conductivity type reversion are implanted into the bottom part of the groove formed in the semiconductor substrate but not into the side walls of the groove. Because parasitic channel effects arise often in the side wall part of the groove, it is not always possible to achieve sufficient element isolation.

FIG. 1 shows the relation between the gate voltage Vg and drain current Id of an insulated gate type field effect transistor (IGFET). The sub-threshold characteristic is shown for insulated gate type field effect transistors provided as semiconductor elements. Curve 3 shows a sub-threshold characteristic comprising a portion of an essentially desirable characteristic curve 1 and a portion of the characteristic curve 2 of a parasitic transistor. Such a characteristic causes a leakage current in the off-state of the transistors and is likely to cause operating errors or failure of elements of the integrated circuit.

SUMMARY OF THE INVENTION

Accordingly, an object of the invention is to provide a method for manufacturing integrated circuit devices which have high dimensional accuracy for the element region and meet high lithography accuracy for the wiring process.

Another object of the invention is to provide a method for manufacturing integrated circuit devices which accomplishes favorable electrical element-isolation and improved element-characteristic by means of preventing generation of parasitic channel effects.

A further object of the invention is to provide a method for manufacturing integrated circuit devices which make it possible to introduce with good controllability impurities of the same conductivity type as that of the semiconductor substrate into the side wall part of the groove for burying insulation material.

These and other objects have been attained by the method for manufacturing integrated circuit devices wherein semiconductor elements are isolated by insulation material comprising the following steps of:

(a) providing a mask pattern on a predetermined semiconductor element region of a semiconductor substrate;

(b) introducing by first ion-implantation impurities of the same conductivity type as that of the substrate into the substrate using the mask pattern as an ion-implantation mask;

(c) etching the substrate and forming a groove there using the mask pattern as an etching mask in a manner that part of the impurities remain at least under the mask pattern;

(d) introducing by second ion-implantation impurities of the same conductivity type as that of the substrate through the groove into the substrate;

(e) burying insulation material in the groove;

(f) forming a semiconductor element on the predetermined semiconductor element region.

This invention applies not only to integrated circuits including insulated gate type field effect transistors, but also to those including bipolar transistors or complementary insulated gate type field effect transistors (CMOS).

According to the invention it is possible to use not only a semiconductor wafer but also SOS Structure wherein a semiconductor layer for making elements is provided on an insulation substrate, or to use SOI Structure wherein a semiconductor layer for making elements is provided on an insulation film on a substrate.

So that part of the impurities will remain in the side wall part of the groove after forming the groove, the impurities of the same conductivity type as that of the substrate are implanted in the form of ions before forming a groove for burying insulation material. Therefore, in accordance with the invention, it is possible to prevent effectively conductivity type inversion in the side wall part of the groove where the problem of parasitic channel generation arises.

According to the invention, the mask pattern should also be used as a mask for the second ion-implantation to increase process accuracy. Furthermore, for the same reason it is desirable that the step of forming the groove is carried out by the reactive ion-etching method, and the step of burying insulation material in the groove, by the lift-off method.

It is preferable to change implantation depth and dose value according to the depth from the semiconductor substrate surface which is required to prevent decrease of the breakdown voltage of the diffusion layers which constitute the semiconductor elements and of operating speed of the elements due to an increase of the junction capacity between the diffusion layers and the substrate.

It is possible to prevent parasitic channel generation more effectively by way of providing a film on the field area in advance of the first implantation of the impurity in the substrate.

In addition, it is possible to prevent parasitic channel generation more effectively when the impurities implanted into the semiconductor substrate are thermally diffused, so that sufficient impurities remain in the side wall parts of the subsequently formed groove.

When insulated gate type field effect transistors are provided as the semiconductor elements, according to an embodiment of the invention, the impurity distribution is projected into the region below the predetermined element region by the second ion-implantation. Consequently, current produced through impact ionization beside the drain regions of the transistors does not flow into the other regions of the semiconductor substrate. Therefore, when dynamic random access memories are provided with the semiconductor elements in the invention, they operate without error.

The invention will be described in detail with reference to the accompanying drawings.

DETAILED DESCRIPTION OF THE PREFERRED EMBODIMENT

One embodiment of the invention will be described in detail with reference to FIGS. 2 to 10.

Figure 1:
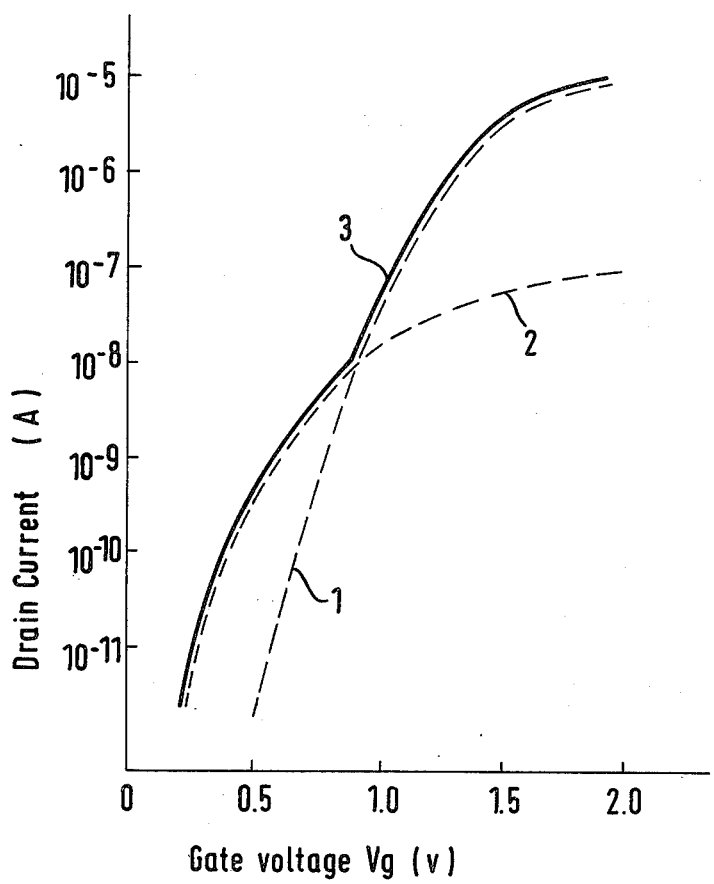
FIG. 1 shows a sub-threshold characteristic due to parasitic channel generation.
Figure 2:
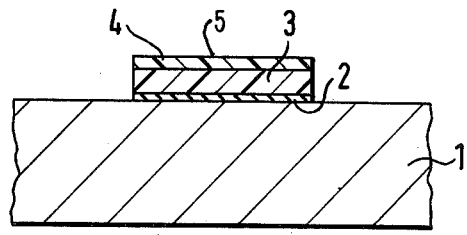
FIGS. 2 to 10 are cross-sectional views of a semiconductor substrate at respective steps of the fabrication method in accordance with one embodiment of the invention.

In FIG. 2, a p-type silicon substrate 1 of a 5–50 Ωcm specific resistivity with a <100> crystal surface orientation is prepared at first. Preferably, gallium arsenic is used for the substrate material.

Next a thermal oxidation film 2 of about 500 Å thickness is formed on substrate 1. A silicon-nitride layer 3 of about 0.5 microns thickness and a resist film 4 are subsequently formed on oxide film 2. Silicon-nitride layer 3 is used as a mask for ion-implantation and etching for subsequent manufacturing steps. Instead of silicon-nitride layer 3, an aluminum layer, a poly-silicon layer or a phosphorous-doped silicon oxide layer can be used.

Resist film 4 is then patterned in accordance with the size of a predetermined element region by a conventional photo-etching method. Silicon-nitride layer 3 and thermal oxidation film 2 are subsequently etched off using resist film pattern 5 as a mask (FIG. 2).

Figure 3:
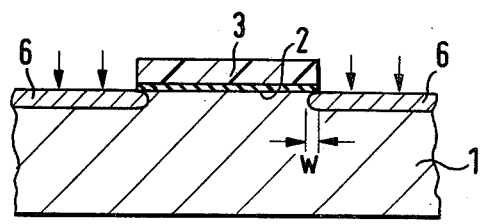

After removing resist film pattern 5, boron ions are implanted into semiconductor substrate 1 using silicon-nitride layer 3 as a mask, so that a p-type region 6 of an impurity concentration higher than that of substrate 1 is formed (FIG. 3). In this process, resist film pattern 5 does not always have to be removed before the ion-implantation. The above first ion-implantation step is carried out for example under the condition of a 140 KeV acceleration voltage and a $1 \times 10^{13}$ cm$^{-2}$ dose value. In this case, the projected depth reaches 0.45 μm, the standard deviation is 0.11 μm, and the lateral extent range W of p-type region 6 into the predetermined element region is 0.14 μm.

Preferably after the ion-implantation, substrate 1 is exposed to a 1000° C. temperature for 30 minutes in a nitrogen gas atmosphere. This heat treatment mades the lateral extent range W expand to 0.3 μm which contributes effectively to preventing conductivity type inversion.

Figure 4:
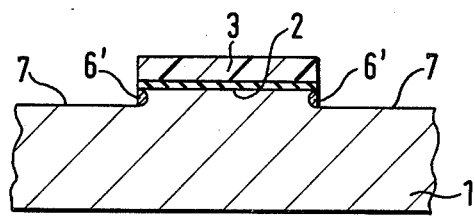
Figure 5:
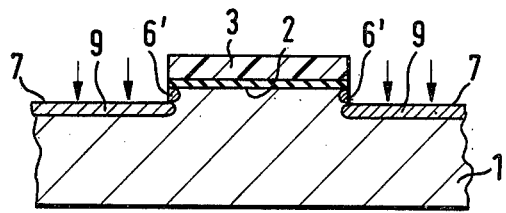

Next semiconductor substrate 1 is partly etched from its surface to 0.4–0.8 μm depth by anisotropic etching method using silicon nitride layer 3 as an etching mask. Considering etching accuracy, reactive ion-etching is desirable to use as the anisotropic etching. A p-type region 6' remains in the side wall part of the groove 7 formed by the above etching process (FIG. 4).

When relatively light ions with a large scattering angle, for example boron, are implanted into the semiconductor substrate, there occurs a wide range ion distribution in the lateral direction under the silicon nitride layer 3, i.e. the ion-implantation mask. After the ion-implantation, the impurity concentration distribution shows a Gaussian distribution with a projected depth Rp and a standard deviation ΔRp in the depth direction. The impurity concentration distribution shows a Gaussian distribution also in the lateral direction, so that it is possible to implant an adequate dosage of boron with high controllability into the side wall part of groove 7.

The narrow channel effect with respect to insulated gate type field effect transistors, which occurs through too much boron implantation and lateral diffusion of impurities in subsequent heat processes, is effectively prevented by the above steps of the present invention. Also decrease of the breakdown voltage of the diffusion layers formed on the predetermined element region is prevented. Finally decrease in operation speed, which is caused by an increase of the junction capacitance between the diffusion layers and the substrate, does not occur.

Figure 6:
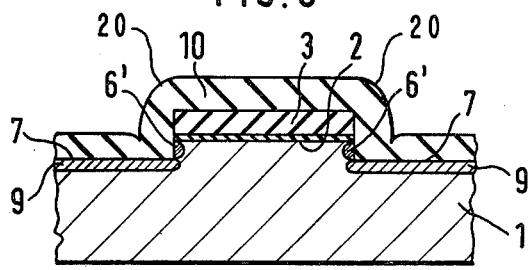
Figure 7:
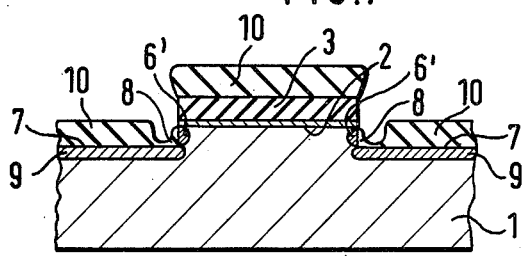

Next boron ions are implanted into groove 7 with a 20–50 KeV acceleration voltage and a $1 \times 10^{12}$ cm$^{-2}$ dose value (a second ion-implantation), so that a p-type region 9 is formed at the bottom part of groove 7. A silicon dioxide film 10 of a 0.6–1.5 microns thickness is formed on the overall surface of substrate 1 through chemical vapor deposition in plasma (FIG. 6).

Another method of forming the silicon dioxide film, for example spattering evaporation or thermal oxidation, can be used in this process. The silicon dioxide film may contain phosphorus, arsenic or boron. Furthermore, it is possible to use fluid glass instead of silicon dioxide.

Subsequently, silicon dioxide film 10 is etched by buffered hydrofluoric acid solution for 1 minute, and is selectively removed at the stair-like portions 20. This is because the Plasma-CVD silicon dioxide film deposited on the stair-like portions 20 between the predetermined element region and the filled area has an etching speed 3–20 times higher than those of the flat portions. After this, semiconductor substrate 1 is exposed under the atmosphere of wet or dry oxygen at a temperature of 1000° C. for 20 minutes. Consequently, a thin oxidation film 8 (FIG. 7) is formed at the periphery of the predetermined element region, which contributes to reliable electrical isolation of the region. However, this step is not always necessary. In the above process, ammonium fluoride can be used for etching silicon dioxide film 10 to achieve the same result.

Figure 8:
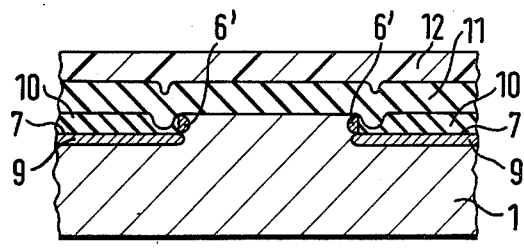

Next, after removal of the mask pattern, a second silicon dioxide film 11 is deposited on silicon dioxide film 10 through chemical vapor deposition. Melted resist is coated and solidified thereon so that a resist film 12 is formed and the surface is flattened (FIG. 8). In this process, it is possible to use a thermal oxidation film or a melted glass such as phosphorsilicate glass or phosphor-boronsilicate glass instead of silicon dioxide film 11 and resist film 12.

Figure 9:
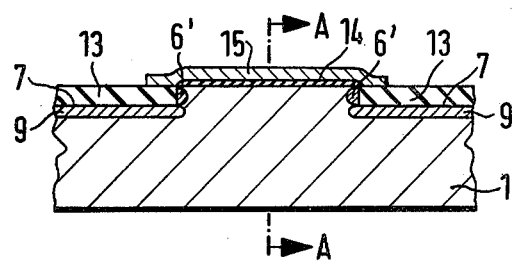
Figure 10:
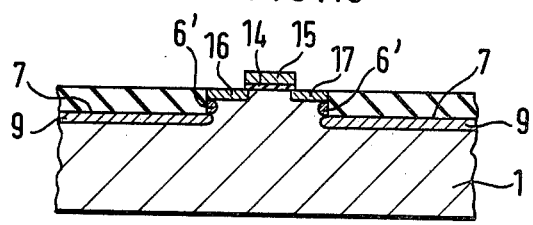

Next resist film 12 and silicon dioxide film 11 are etched under the condition in which the etching rate of resist film 12 is equal to that of the silicon dioxide film 11 till the predetermined element region is exposed, so that a flat field oxide film 13 is formed without leaving any stair-like portion (FIG. 9). A gate oxide film 14 is formed on the exposed predetermined element region of semiconductor substrate 1 by thermal oxidation, and then a poly-silicon film is formed thereon. By patterning the poly-silicon film through a lithography technique, a gate electrode 15 is formed and gate oxide film 14 is etched off. As shown in FIG. 10, which is a cross-sectional view taken along line A—A given in FIG. 9, arsenic ions are implanted into semiconductor substrate 1 using gate electrode 15 as an implantation mask. As a result, a source region 16 and a drain region 17 are formed and an insulated gate type field effect transistor is completed. Additionally, metal interconnections are provided on substrate 1 and an integrated circuit is made (not shown in Figures).

Figure 11:
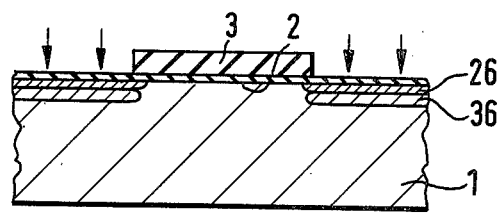
FIGS. 11 to 13 are cross-sectional views of a semiconductor substrate at respective steps of ion-implantation into a semiconductor substrate in accordance with a variation of the preceding embodiment.

FIG. 11 shows modified embodiment of the above first ion-implantation step (FIG. 3). According to this embodiment, oxidation film 2 overlays the field area, during ion-implantation, differing from the step shown in FIG. 3. In this embodiment, a p-type region 26 is formed by ion-implantation with a 130 KeV acceleration voltage and a $1 \times 10^{13}$ cm$^{-2}$ dose value, and additionally a p-type region 36 is formed by another ion-implantation with a 150 KeV acceleration voltage and a $3 \times 10^{12}$ cm$^{-2}$ dose value. Because of the existence of oxidation film 2, the impurity concentration distribution produced through the former ion-implantation step shows a maximum value at the surface region of substrate 1. Through the latter ion-implantation step, a small dosage of impurities is introduced into the deep region of substrate 1. Accordingly, conductivity type inversion in the surface region, where the parasitic channel tends to arise, is effectively prevented. Furthermore, decrease of breakdown voltage of the diffusion layers which constitute the elements and increase of the junction capacitance are both prevented.

Figure 12:
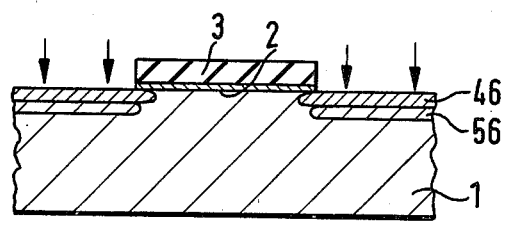

FIG. 12 shows a further modified embodiment of the above first ion-implantation step (FIG. 3). In this embodiment, a p-type region 46 is formed by ion-implantation with a 50 KeV acceleration voltage and a $1 \times 10^{13}$ cm$^{-2}$ dose value and a p-type region 56 is formed by another ion-implantation step with a 180 KeV acceleration voltage and a $2 \times 10^{12}$ dose value. According to this embodiment, the same effect as that of the embodiment in FIG. 11 can be expected.

Figure 13:
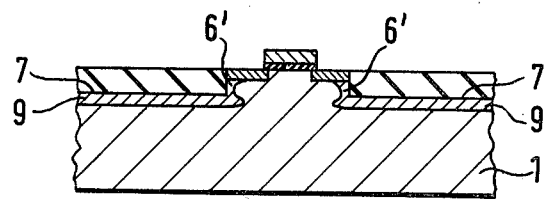

FIG. 13 shows yet another modified embodiment of the second ion-implantation step (FIG. 5) after the step of FIG. 12 is followed. The implantation is carried out with a 250 KeV acceleration voltage and a $1 \times 10^{14}$ cm$^{-2}$ dose value in order that the ion-implantation impurity distribution projects far into the region under the predetermined element region.

According to this embodiment, in the case that insulated gate type field effect transistors are used as the elements in the invention, it is possible to prevent current avalanche produced through impact ionization adjacent the drain regions of the transistors upon the other regions of semiconductor substrate 1.

What is claimed is:

1. A method of forming planar isolation regions having inversion regions comprising the steps of:
   (a) providing a mask pattern on a predetermined semiconductor element region of a semiconductor substrate;
   (b) introducing by ion-implantation impurities of the same conductivity type as that of the substrate into the substrate using the mask pattern as an ion-implantation mask;
   (c) etching in the ion-implanted substrate directly to form a groove so that part of the impurities remain at least in the side wall of the groove; and
   (d) burying insulation material in the groove by deposition.

2. The method according to claim 1, wherein the mask pattern is used as the mask for the second ion-implantation.

3. The method according to claim 1, wherein the groove is formed by reactive ion etching.

4. The method according to claim 1, wherein the method for burying insulation material in the groove comprises the following steps of: forming a first silicon oxide layer on the semiconductor substrate having a groove by chemical vapor deposition in plasma; etching off the first silicon oxide layer at the periphery of the mask pattern; removing the mask pattern; providing a second silicon oxide layer on the remaining portions of the first silicon oxide layer; providing a melted film on said second silicon oxide layer and solidifying it; etching the solidified film and the new silicon oxide layer in order to leave a flat silicon oxide layer in the groove.

5. The method according to claim 1, wherein the impurity dose value and the acceleration voltage are changed during the first ion-implantation in order to decrease the impurity concentration according to the depth from the substrate surface.

6. The method according to claim 1, wherein the first ion-implantation is carried out under the condition that an oxide film exists on the overall surface of the substrate.

7. The method according to claim 1, wherein the method further includes the step of diffusing the impurities introduced into the substrate after step (b).

8. The method according to claim 1, wherein the impurity distribution is projected under the predetermined element region through the second ion-implantation.

9. The method according to claim 1 also including between the steps of etching and burying the step of introducing, by second ion-implantation, impurities of the same conductivity type as that of the substrate directly through surface of the groove into the substrate.

* * * * *